US011353798B2

(12) United States Patent
Yamamoto et al.

(10) Patent No.: US 11,353,798 B2
(45) Date of Patent: Jun. 7, 2022

(54) PATTERN MEASUREMENT DEVICE AND PATTERN MEASUREMENT METHOD

(71) Applicant: Hitachi High-Technologies Corporation, Tokyo (JP)

(72) Inventors: Takuma Yamamoto, Tokyo (JP); Hiroya Ohta, Tokyo (JP); Kenji Tanimoto, Tokyo (JP); Yusuke Abe, Tokyo (JP); Tomohiro Tamori, Tokyo (JP); Masaaki Nojiri, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 275 days.

(21) Appl. No.: 16/645,885

(22) PCT Filed: Oct. 13, 2017

(86) PCT No.: PCT/JP2017/037172
§ 371 (c)(1),
(2) Date: Mar. 10, 2020

(87) PCT Pub. No.: WO2019/073592
PCT Pub. Date: Apr. 18, 2019

(65) Prior Publication Data
US 2020/0278615 A1 Sep. 3, 2020

(51) Int. Cl.
*G03F 7/20* (2006.01)
*G01B 15/04* (2006.01)
*G01N 23/225* (2018.01)

(52) U.S. Cl.
CPC ......... *G03F 7/70625* (2013.01); *G01B 15/04* (2013.01); *G01N 23/225* (2013.01);
(Continued)

(58) Field of Classification Search
CPC . G03F 7/70625; G03F 7/72059; G01B 15/04; G01N 23/225
(Continued)

(56) References Cited

U.S. PATENT DOCUMENTS 6,452,175 B1   9/2002   Adamec
7,164,128 B2   1/2007   Miyamoto et al.
(Continued)

FOREIGN PATENT DOCUMENTS

CN   104718428 A   6/2015
CN   104919307 A   9/2015
(Continued)

OTHER PUBLICATIONS

International Search Report (PCT/ISA/210) issued in PCT Application No. PCT/JP2017/037172 dated Jan. 9, 2018 with English translation (four (4) pages).
(Continued)

*Primary Examiner* — Hung V Nguyen
(74) *Attorney, Agent, or Firm* — Crowell & Moring LLP

(57) ABSTRACT

The present invention has a computation device for measuring the dimensions of patterns formed on a sample on the basis of a signal obtained from a charged particle beam device. The computation device has a positional deviation amount calculation unit for calculating the amount of positional deviation in a direction parallel to a wafer surface between two patterns having different heights on the basis of an image acquired at a given beam tilt angle; a pattern inclination amount calculation unit for calculating an amount of pattern inclination from the amount of positional deviation using a predetermined relational expression for the amount of positional deviation and the amount of pattern inclination; and a beam tilt control amount calculation unit for controlling the beam tilt angle so as to match the amount
(Continued)

of pattern inclination. The pattern measurement device sets the beam tilt angle to a calculated beam tilt angle, reacquires an image and measures the patterns.

19 Claims, 15 Drawing Sheets

(52) U.S. Cl.
CPC .... *G03F 7/2059* (2013.01); *H01J 2237/2815* (2013.01); *H01J 2237/2817* (2013.01)

(58) Field of Classification Search
USPC ............................................ 356/237.2, 237.5
See application file for complete search history.

(56) References Cited

U.S. PATENT DOCUMENTS

| 9,224,575 | B2 | 12/2015 | Yamamoto et al. |
|---|---|---|---|
| 10,816,332 | B2 * | 10/2020 | Ohta ........................ H01J 37/20 |
| 2012/0211676 | A1 | 8/2012 | Kamikubo |
| 2015/0228063 | A1 | 8/2015 | Minakawa et al. |
| 2015/0276375 | A1 | 10/2015 | Liu et al. |
| 2016/0056014 | A1 | 2/2016 | Yamamoto et al. |
| 2016/0063690 | A1 | 3/2016 | Ushiba et al. |
| 2016/0379798 | A1 | 12/2016 | Shishido et al. |
| 2017/0122890 | A1 | 5/2017 | Inoue et al. |
| 2017/0343340 | A1 | 11/2017 | Kawada et al. |

FOREIGN PATENT DOCUMENTS

| JP | 4500653 | B2 | 7/2010 |
|---|---|---|---|
| JP | 2011-77299 | A | 4/2011 |
| JP | 4689002 | B2 | 5/2011 |
| JP | 2014-170751 | A | 9/2014 |
| JP | 2015-106530 | A | 6/2015 |
| JP | 2015-158462 | A | 9/2015 |
| JP | 5965819 | B2 | 8/2016 |
| TW | 201621270 | A | 6/2016 |
| WO | WO 2014/181577 | A1 | 11/2014 |
| WO | WO 2017/179138 | A1 | 10/2017 |

OTHER PUBLICATIONS

Japanese-language Written Opinion (PCT/ISA/237) issued in PCT Application No. PCT/JP2017/037172 dated Jan. 9, 2018 (five (5) pages).
Chinese-language Office Action issued in Chinese Application No. 201780094300.2 dated Nov. 18, 2021 (seven (7) pages).
Chinese language Office Action issued in Chinese Application No. 201780094300.2 dated Mar. 30, 2021 (seven (7) pages).

* cited by examiner

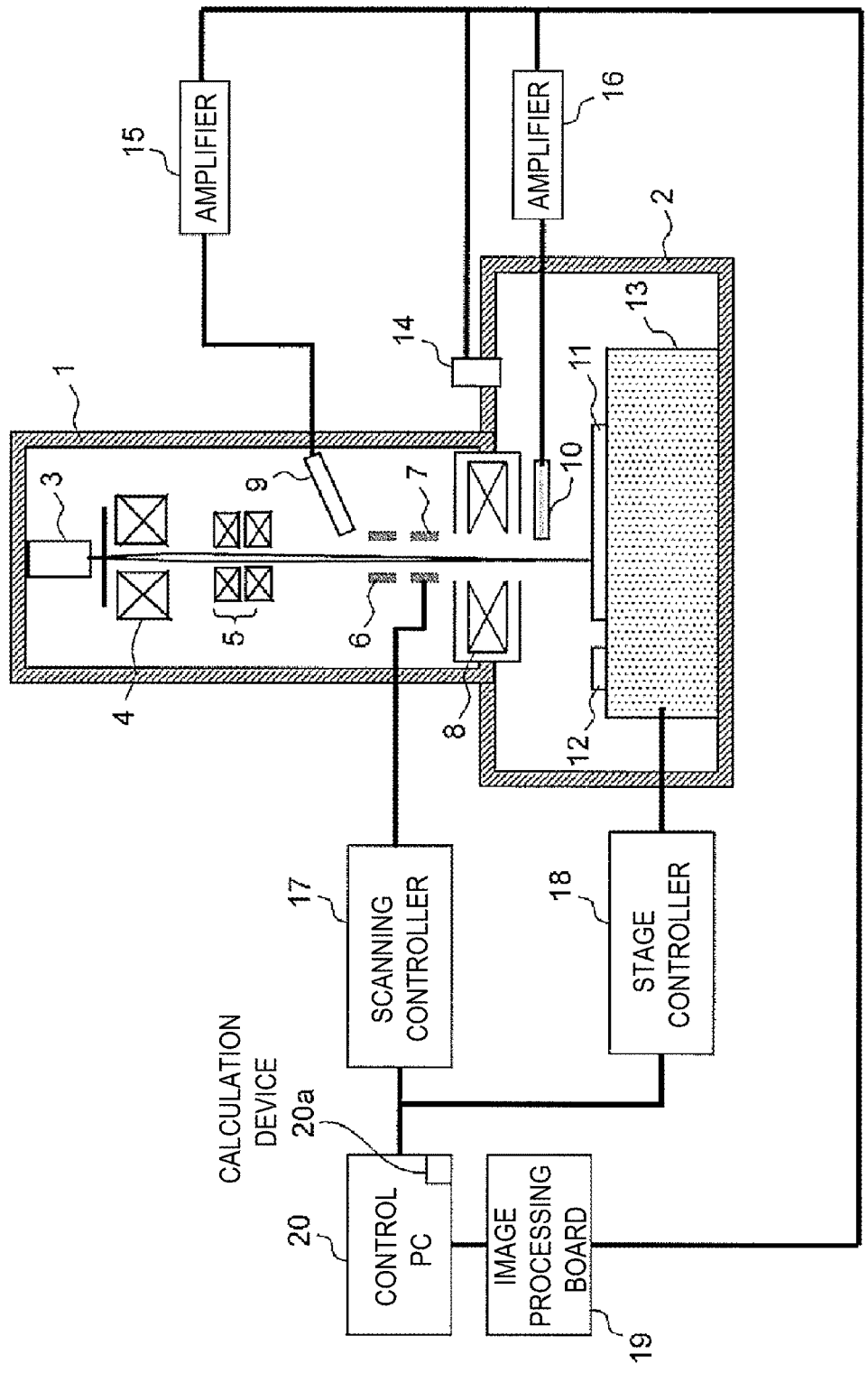
[FIG. 1A]

[FIG. 1B]
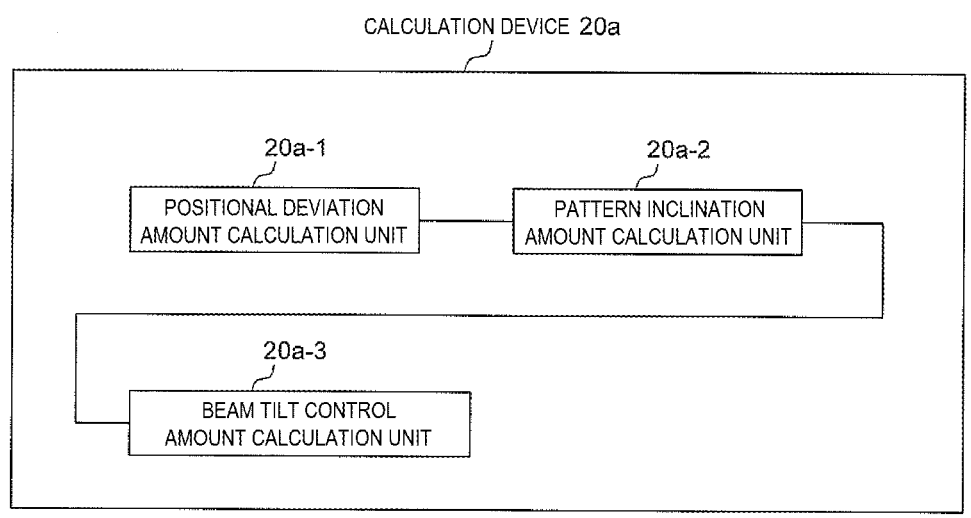

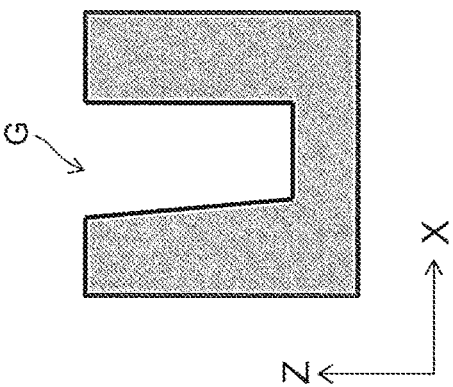
FIG. 2A
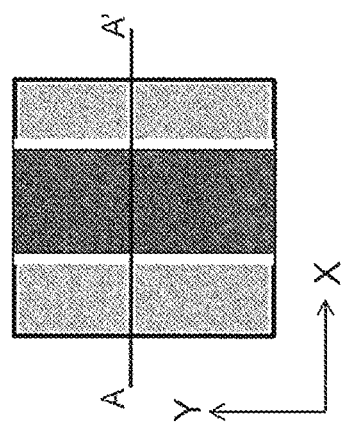
FIG. 2B
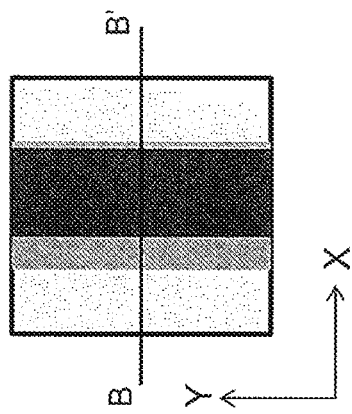
FIG. 2C
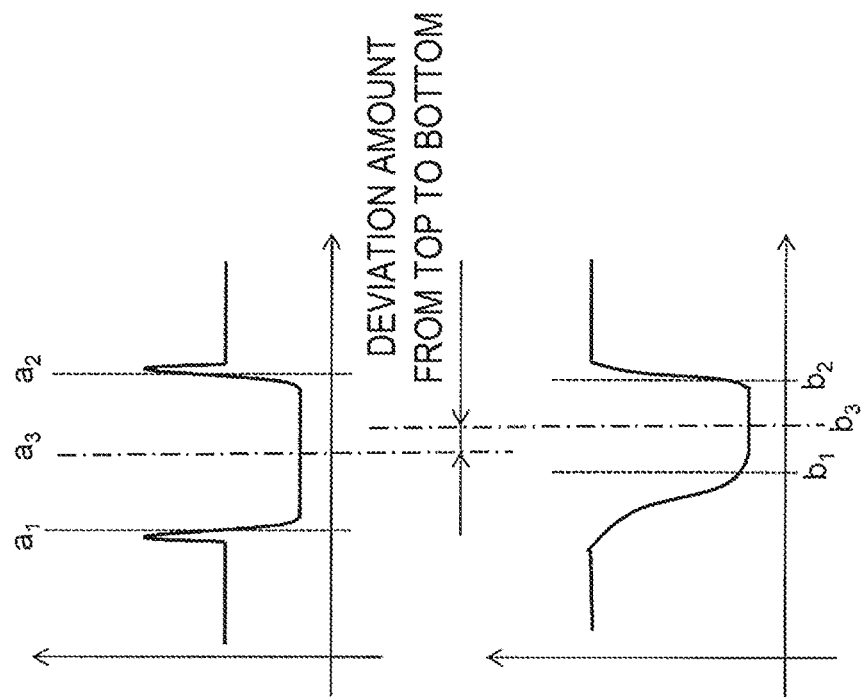
FIG. 2D
FIG. 2E

BEAM INCIDENT ANGLE: 0°

SHIFTED TO +X DIRECTION

BEAM INCIDENT ANGLE: −α°

NO DEVIATION

BEAM INCIDENT ANGLE: −2α°

SHIFTED TO −X DIRECTION

[FIG. 5]
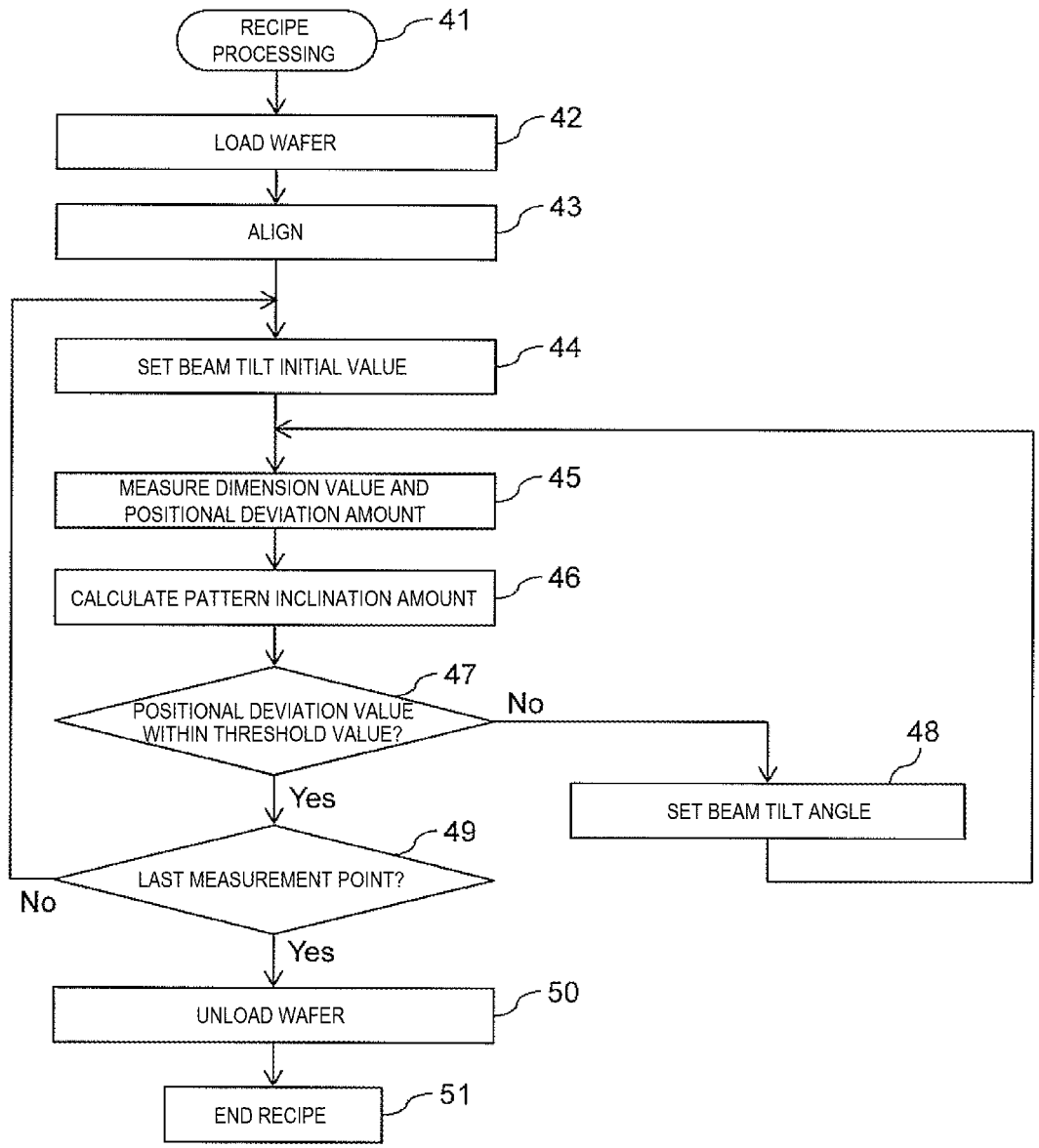

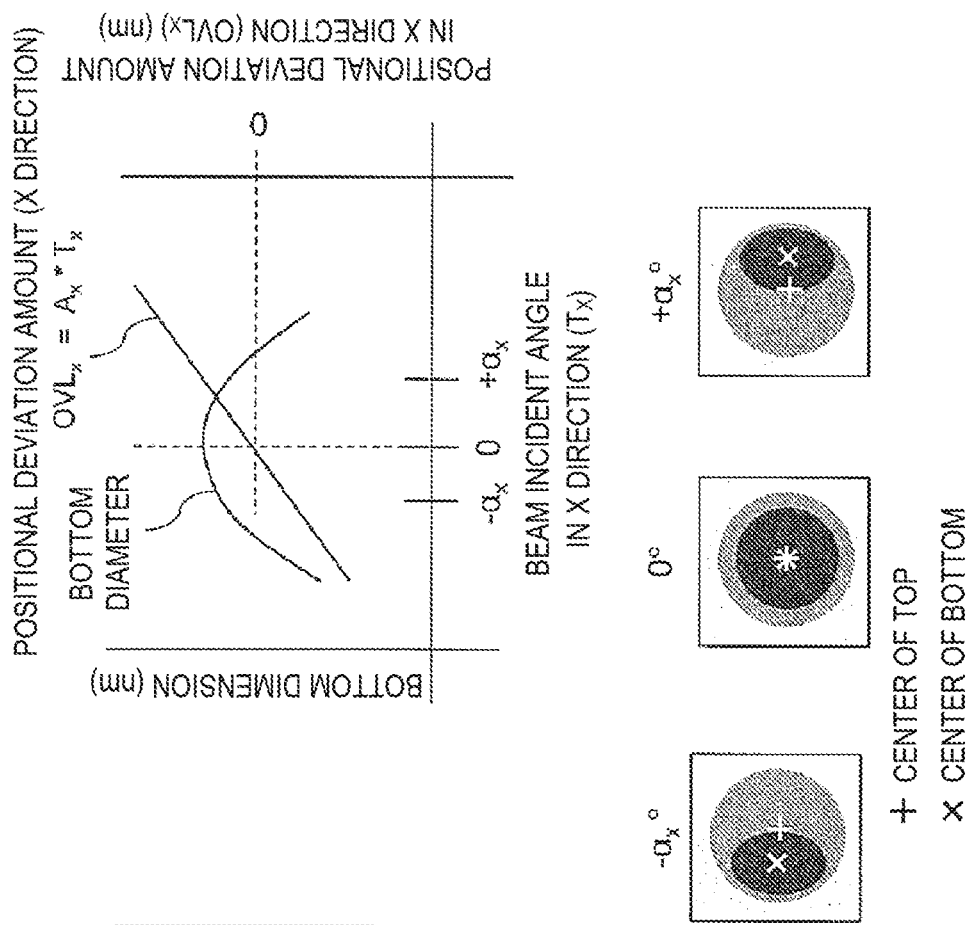
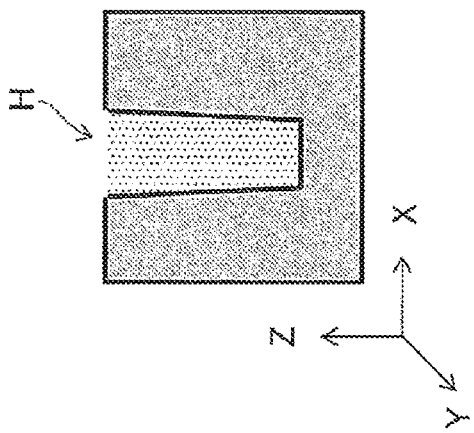
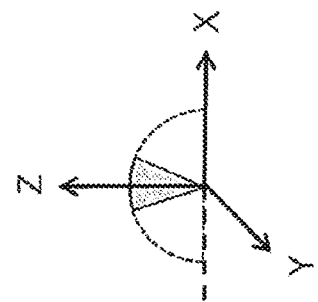

[FIG. 7]
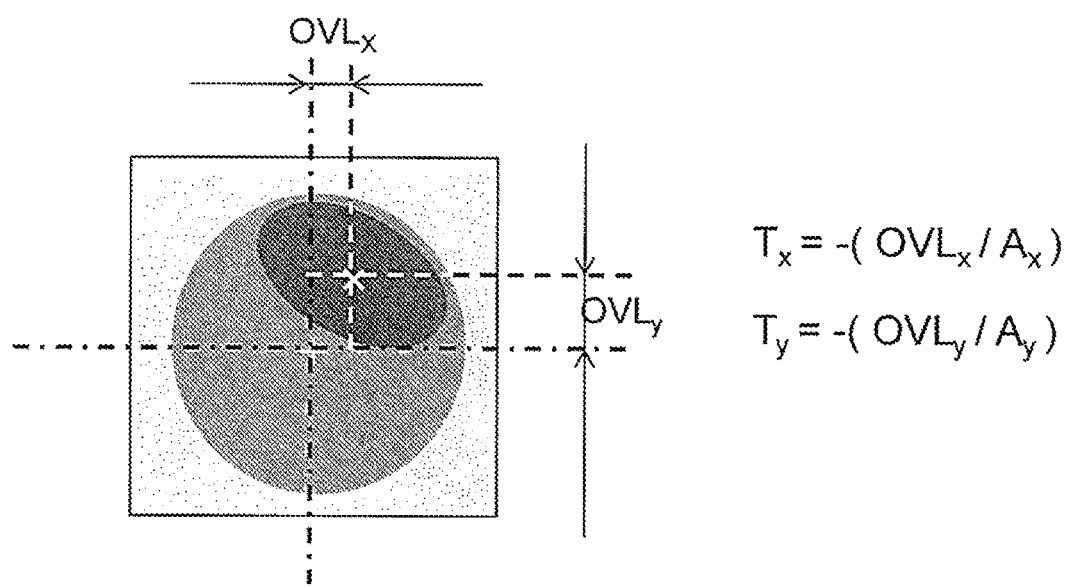

[FIG. 8]

| No | Chip_X 61 | Chip_Y 62 | Pos_X (μm) 63 | Pos_Y (μm) 64 | Top_CD (nm) 65 | Bottom_CD (nm) 66 | Tilt_X (deg) 67 | Tilt_Y (deg) 68 | Tilt (DIRECTION) 69 | Tilt (ABSOLUTE VALUE) 70 |
|---|---|---|---|---|---|---|---|---|---|---|
| 1 | -2 | 0 | 1000 | 2000 | 200 | 180 | -0.8 | 0.0 | 180 | 0.8 |
| 2 | -1 | 0 | 1000 | 2000 | 201 | 181 | 0.5 | 0.5 | 45 | 0.7 |
| 3 | 0 | 0 | 1000 | 2000 | 196 | 177 | 0.0 | 0.5 | 90 | 0.5 |
| 4 | 1 | 0 | 1000 | 2000 | 199 | 180 | -0.5 | -0.5 | 225 | 0.7 |
| 5 | 2 | 0 | 1000 | 2000 | 201 | 179 | 0.0 | -0.3 | 270 | 0.3 |

$OVL_1 = D_1 \times \sin(-\alpha)$ $OVL_2 = (D_1 + \Delta D) \times \sin(-\alpha)$

[FIG. 10]
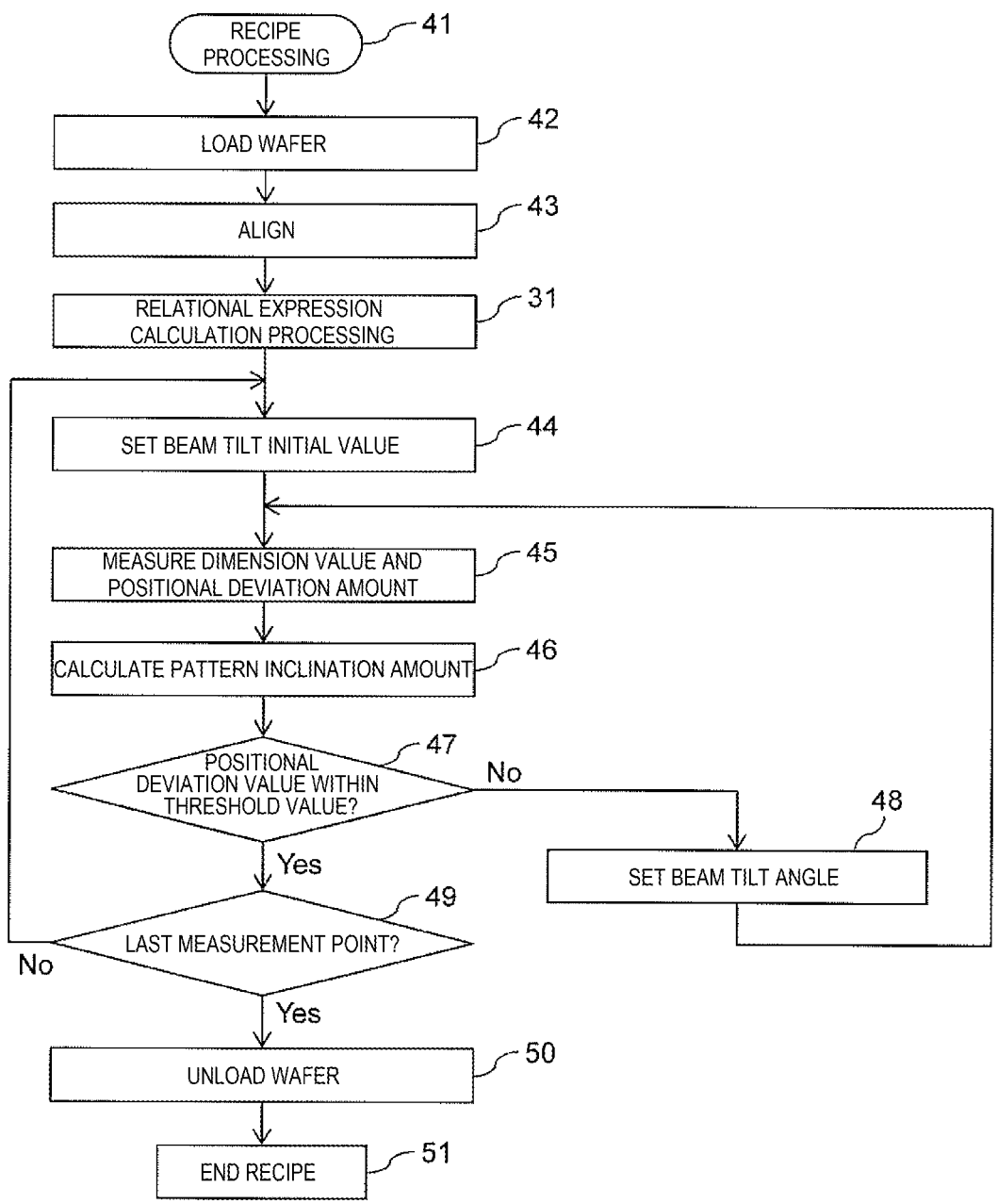

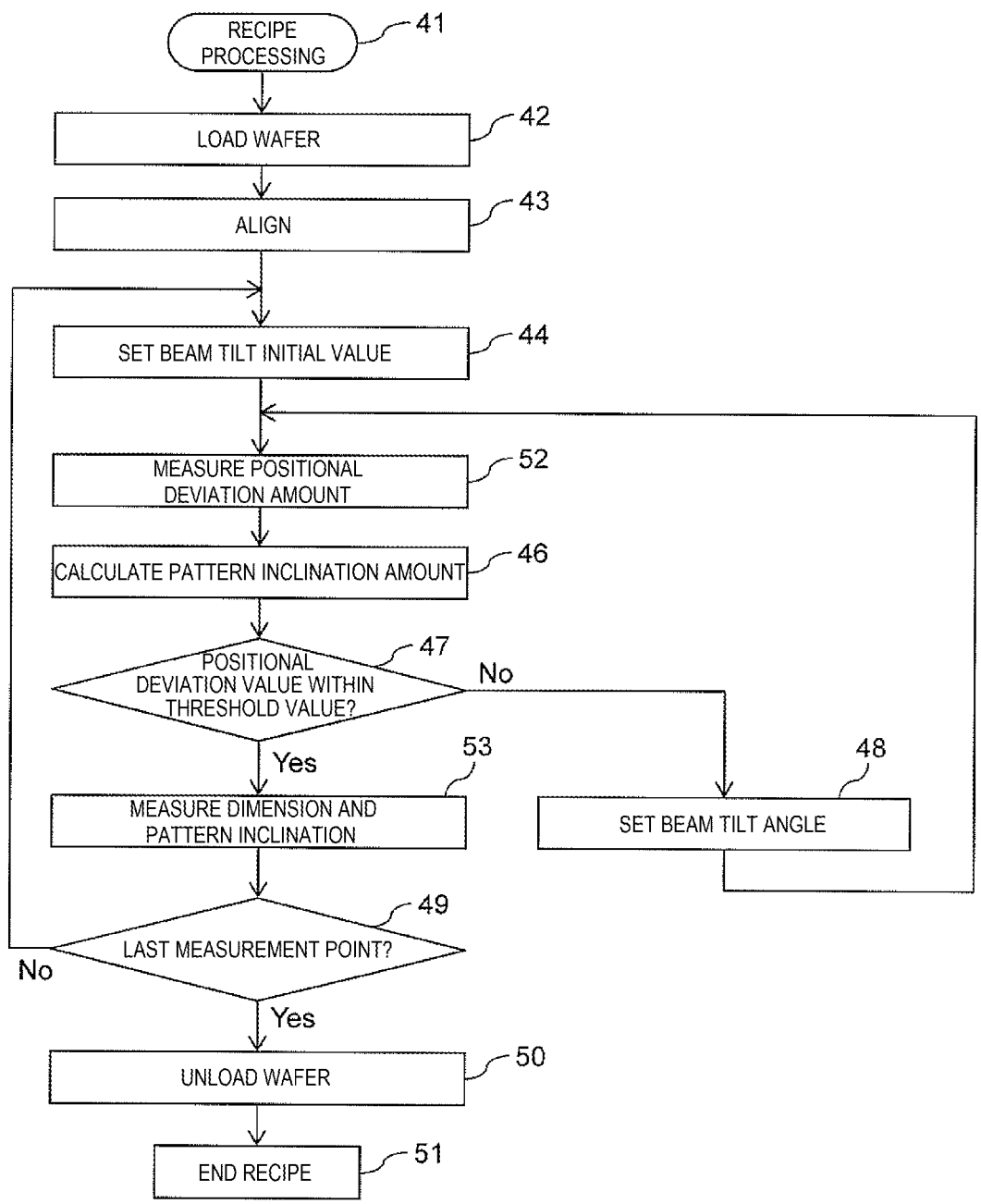
[FIG. 12]

PATTERN MEASUREMENT DEVICE AND PATTERN MEASUREMENT METHOD

TECHNICAL FIELD

The present invention relates to a measurement technique in a process of manufacturing a semiconductor device, and particularly to a measurement technique for patterns such as a deep hole or a deep groove.

BACKGROUND ART

A semiconductor device is manufactured by repeating a step of transferring a pattern formed on a photomask on a semiconductor wafer by a lithography processing and an etching processing. In the process of manufacturing the semiconductor device, quality of the lithography processing or the etching processings, generation of foreign matters, and the like greatly affect a yield of the semiconductor device. Therefore, in order to detect such abnormalities and defects in the manufacturing process early or in advance, measurement and inspection of a pattern on a semiconductor wafer are performed in the manufacturing process, and measurement using a scanning electron microscope (SEM) is widely performed when high accuracy measurement is required.

In recent years, the progress of miniaturization is slowed, while the progress of high integration by three-dimensionalization is remarkable, as represented by 3D-NAND. There is a growing need for measurement of overlap of patterns between different steps and pattern shapes of deep holes and grooves. For example, a depth measurement for a deep hole or a deep groove using an electron beam device (PTL 1) and overlap measurement between different steps utilizing a plurality of detector signals (PTL 2) are reported.

Although the deep hole and the deep groove are processed by an etching process, as a pattern to be processed becomes deeper, the required processing accuracy becomes stricter. Therefore, it is important to measure a verticality, a processing depth, a bottom dimension, and the like of the pattern to be processed in a wafer surface and apply feedback to an etching device. For example, when a state of an etcher is not good, there is a case where processing uniformity is reduced on an outer periphery of the wafer and the pattern is processed to be inclined.

It is known that, when observing and measuring not only semiconductor patterns but also three-dimensional shapes using the scanning electron microscope, a cross-sectional shape such as a pattern height and a sidewall angle, and three-dimensional reconstruction can be implemented by inclining a sample stage or an electron beam, changing an incident angle with respect to a sample, using so-called stereo observation with a plurality of images different from irradiation from the top (PTL 3). In this case, set angle accuracy of the sample and the beam greatly affects the accuracy of the obtained cross-sectional shape and the reconstructed three-dimensional shape. Therefore, high accuracy angle calibration is implemented (PTL 4).

CITATION LIST

Patent Literature

PTL 1: JP-A-2015-106530
PTL 2: Japanese Patent No. 5965819 (corresponding to U.S. Pat. No. 9,224,575)
PTL 3: Japanese Patent No. 4689002 (corresponding to U.S. Pat. No. 6,452,175)
PTL 4: Japanese Patent No. 4500653 (corresponding to U.S. Pat. No. 7,164,128)

SUMMARY OF INVENTION

Technical Problem

As the device becomes three-dimensional and the patterns of grooves and holes to be processed become deeper, management of the etching process becomes more important.

An object of the invention is to correctly measure information for applying feedback to an etching process, that is, a bottom dimension, a pattern inclination, and a pattern depth of a pattern to be processed.

Solution to Problem

As one embodiment for solving the above-described problems, the invention provides a pattern measurement device using an electron beam, which calculates a positional deviation amount between a surface and a bottom of an etched pattern in a direction parallel to a wafer surface based on an image acquired at any incident beam angle, calculates an inclination amount of the pattern based on the positional deviation amount according to a relational expression between a relative angle between the incident beam acquired in advance and the etching pattern and the positional deviation amount, obtains an image again at an incident beam angle set to match etching pattern inclination and measures the pattern.

According to one aspect of the invention, a pattern measurement device includes a calculation device that measures a dimension of a pattern formed on a sample based on a signal obtained by a charged particle beam device. The calculation device includes a positional deviation calculation unit that calculates a positional deviation amount between two patterns having different heights in a direction parallel to the wafer surface based on an image acquired at any beam tilt angle, a pattern inclination amount calculation unit that calculates an inclination amount of the pattern based on the positional deviation amount according to a relational expression between the positional deviation amount acquired in advance and the inclination amount of the pattern, and a beam tilt control amount calculation unit that controls a beam tilt angle to match the inclination amount of the pattern. The calculated beam tilt angle is set, the image is acquired again, and the pattern is measured.

The invention may also relates to a pattern measurement device, a pattern formation method, and a program for causing a computer to execute the pattern formation method.

Advantageous Effect

According to the invention, the incident beam reaches the bottom of an etched pattern, and accurate measurement of the bottom dimension and an inclination angle of the etched pattern can be performed.

BRIEF DESCRIPTION OF DRAWINGS

FIG. 1A is a schematic diagram showing a configuration example of a device shown in first to fifth embodiments.

FIG. 1B is a functional block diagram showing a configuration example of a calculation device.

FIGS. 2A to 2E show diagrams showing a principle of positional deviation measurement.

FIG. 5 is an explanatory diagram of a recipe sequence according to the first embodiment.

FIGS. 6A to 6C show diagrams showing a principle of tilt correction for an incident beam with respect to a hole pattern according to the second embodiment.

FIG. 7 is a diagram showing an example of the tilt correction for the incident beam with respect to the hole pattern according to the second embodiment.

FIG. 8 is a diagram showing an example of a measurement result output for a hole pattern according to the second embodiment.

FIG. 10 is a diagram showing an example of a recipe sequence to which a relational expression calculation processing is added according to the third embodiment.

FIG. 12 is a diagram showing an example of a recipe sequence according to the fifth embodiment.

DESCRIPTION OF EMBODIMENTS

Figure 3B:
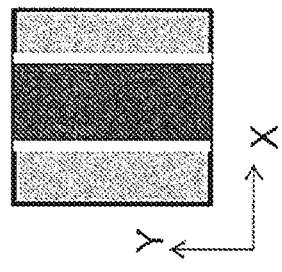
FIGS. 3A to 3E show diagrams showing an effect of an incident beam tilt.
Figure 3E:
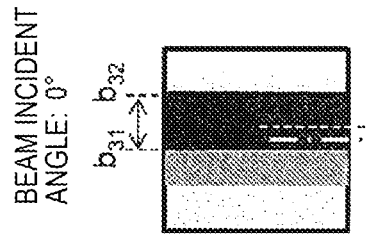
Figure 3D:
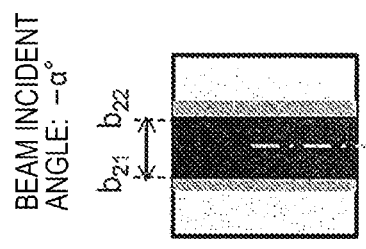
Figure 3C:
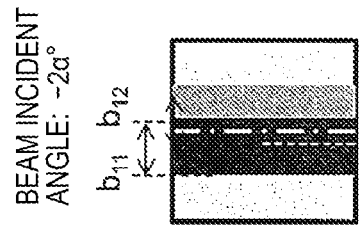

Hereinafter, embodiments of the invention will be described in detail with reference to the drawings.

Hereinafter, an example in which a scanning electron microscope is used as an example of a pattern dimension measurement device that controls an incident beam to match pattern inclination based on a deviation amount between a position of a pattern in an upper layer and a position of a pattern in a lower layer of a sample using an image acquired by irradiation of charged particle beams will be described. This is merely an example of the invention, and the invention is not limited to the embodiments described below.

In the invention, a charged particle beam device broadly includes a device that captures an image of a sample using charged particle beams. Examples of the charged particle beam device include an inspection device, a review device, and a pattern measurement device using a scanning electron microscope. The invention can also be applied to a general-purpose scanning electron microscope or a sample processing device or a sample analyzing device provided with the scanning electron microscope. Hereinafter, the charged particle beam device includes a system in which the above charged particle beam devices are connected via a network or a composite device including the above charged particle beam devices.

In the present description, an example in which a "sample" is a semiconductor wafer on which a pattern is formed will be described, and the invention is not limited thereto.

First Embodiment

FIG. 1A is a diagram showing a configuration example of a pattern measurement device according to a first embodiment. A device main body includes a column 1, which is an electron optical system, and a sample chamber 2. The column 1 includes an electron gun 3, a condenser lens 4, an objective lens 8, a deflector 7, an aligner 5, a secondary electron detector 9, an ExB filter 6, and aback scattered electron detector 10. A primary electron beam (an irradiation electron) generated by the electron gun 3 converges and is emitted onto a wafer 11 with the condenser lens 4 and the objective lens 8. The aligner 5 aligns a position at which the primary electron beam is incident on the objective lens 8. The wafer 11 is scanned with the primary electron beam by the deflector 7. The deflector 7 scans the wafer 11 with the primary electron beam according to a signal from a beam scanning controller 17. Secondary electrons obtained from the wafer 11 by the irradiation of the primary electron beam are directed toward a direction of the secondary electron detector 9 by the ExB filter 6, and detected by the secondary electron detector 9. Back scattered electrons from the wafer 11 are detected by the back scattered electron detector 10. The secondary electrons and the back scattered electrons are collectively referred to as signal electrons obtained from a sample by electron beam irradiation. A charged particle optical system may include other lenses, electrodes, and detectors in addition to the above, or may be partially different from the above, and the configuration of the charged particle optical system is not limited to thereto. An XY stage 13 installed in the sample chamber 2 moves the wafer 11 with respect to the column 1 according to a signal from a stage controller 18. A standard sample 12 for beam calibration is mounted on the XY stage 13. The device includes an optical microscope 14 for wafer alignment. Signals from the secondary electron detector 9 and the back scattered electron detector 10 are signal-converted by amplifiers 15 and 16 and the obtained signals are sent to an image processing board 19 for image formation. Operation of the overall device of the overlap pattern dimension measurement device of the present embodiment is controlled by a control PC 20. The control PC includes an input unit for an instruction input by a user, such as a mouse or a keyboard, a display unit such as a monitor that displays a screen, and a storage unit such as a hard disk or a memory. In addition, a calculation device 20a that performs calculation described below may be provided here.

The charged particle beam device further includes a control unit that controls the operation of each part and an image generation unit that generates an image based on a signal output from a detector (not shown). The control unit and the image generation unit may be configured as hardware by a dedicated circuit board, or may be configured as software executed by a computer connected to the charged particle beam device. In the case of the hardware configuration, it can be implemented by integrating a plurality of calculation units that execute a processing on a wiring substrate or in a semiconductor chip or a package. In the case of the software configuration, it can be implemented by mounting a high-speed general-purpose CPU on a computer and executing a program for executing a desired calculation processing. It is also possible to upgrade an existing device using a recording medium on which the program is recorded. Further, these devices, circuits, and computers are connected via a wired or wireless network, and data is transmitted and received as appropriate.

FIG. 1B is a functional block diagram showing a configuration example of the calculation device that performs the following operation.

As shown in FIG. 1B, the calculation device includes a positional deviation amount calculation unit 20a-1, a pattern inclination amount calculation unit 20*a*-2, and a beam tilt control amount calculation unit 20*a*-3.

The positional deviation amount calculation unit 20*a*-1 calculates a positional deviation amount between two patterns having different heights in a direction parallel to the wafer surface based on an image acquired at any beam tilt angle.

The pattern inclination amount calculation unit 20*a*-2 calculates an inclination amount of a pattern based on the positional deviation amount according to a relational expression between the positional deviation amount obtained in advance and an inclination amount of the pattern (a pattern inclination amount).

The beam tilt control amount calculation unit 20*a*-3 calculates a beam tilt control amount to match the pattern inclination.

Then, the calculated beam tilt control amount is set, the image is again acquired, and the pattern is measured.

The aligner 5 separates the electron beam from an ideal optical axis by an upper deflector, and deflects the electron beam by a lower deflector to have a desired inclination angle. Although FIG. 1A illustrates an inclination beam deflector including a two-stage deflector, a multiple-stage deflector may be provided according to the purpose and required accuracy. Further, the sample may be irradiated with an inclined beam by inclining the XY stage.

An incident angle of the electron beam can be calibrated for the XY stage or the sample. For example, the standard sample 12 has patterns etched into a pyramid shape, and by deflecting the electron beam by the deflector such that four faces of the pyramid appearing in the image have the same shape, an electron beam trajectory may be matched with the ideal optical axis. The trajectory of the electron beam can also be adjusted to obtain a desired inclination angle based on geometric calculation of each surface of the pyramid. A deflection condition (a control value) of the deflector is determined based on such calculation. By calibrating the beam trajectory such that the electron beam has an accurate inclination angle for each of a plurality of angles, and storing the control values of the deflector at that time, beam irradiation at a plurality of irradiation angles described below can be appropriately performed. The measurement using the inclined beam can be automatically performed by performing beam irradiation under a pre-calibrated deflection condition.

In the present embodiment, a relative angle between the sample and the electron beam is set as a beam incident angle. However, a relative angle between the ideal optical axis and the electron beam may be defined as the beam incident angle. In a typical electron beam measurement device (SEM), the electron beam trajectory is basically set to be perpendicular to a movement trajectory (an X direction and a Y direction) of the XY stage. A Z direction is defined as a zero degree, and inclination angles are indicated by plus and minus numbers in both the X and Y directions. It is possible to set angles in all directions by combining X and Y.

Next, an outline of measuring a deviation amount between a pattern surface and a pattern bottom using a waveform signal (a profile waveform) obtained by beam scanning will be described with reference to FIG. 2. FIG. 2(*a*) is a cross-sectional view of a groove-shaped pattern G. A dimension of a lower part of the groove is smaller than that of an upper part thereof, and a side wall has a relative angle of 0.1 to 0.2 degree with respect to a perpendicular (a Z axis) of the sample. FIGS. 2(*b*) and (*c*) are diagrams showing an example of images obtained by the detector 9 and the detector 10 based on beam scanning with respect to the pattern illustrated in FIG. 2(*a*). In these images, a groove pattern having the Y direction as a longitudinal direction is displayed. When performing the beam scanning, two-dimensional scanning is performed by scanning in a line shape in the X direction and moving the scanning position in the Y direction. The center of the image corresponds to the groove bottom, and is usually darker than the upper part.

FIG. 2(*b*) is an image obtained by the detector 9 that mainly detects signals of the secondary electrons, in which etched parts at both ends of the groove appear bright. In addition, FIG. 2(*c*) is an image obtained by the detector 10 that mainly detects signals of the back scattered electrons, in which luminance decreases as the groove becomes deeper. FIG. 2(*d*) is a diagram showing a signal intensity waveform example of one line at a position of A-A'. Since the secondary electrons are likely to be emitted from a sample surface, the etched parts at both ends of the groove have a luminance peak. In the first embodiment, the pattern dimension is measured based on threshold value setting. 50% of a maximum luminance is set as a threshold value, and a midpoint $a_3$ on the upper part of the groove is calculated based on intersection points $a_1$ and $a_2$ of the threshold value and the signal waveform according to an expression $(a_1+a_2)/2$. Similarly, FIG. 2(*e*) shows a signal intensity waveform of one line at a position B-B', and a deeper part of the groove has lower luminance. 10% of the maximum luminance is set as the threshold value, and a midpoint $b_3$ on the upper part of the groove is calculated based on intersection points $b_1$ and $b_2$ of the threshold value and the signal waveform according to an expression $(b_1+b_2)/2$. Next, a deviation of a center position of the bottom of the groove with respect to the center position of the surface of the groove is calculated as $(b_3-a_3)$.

Figure 3A:
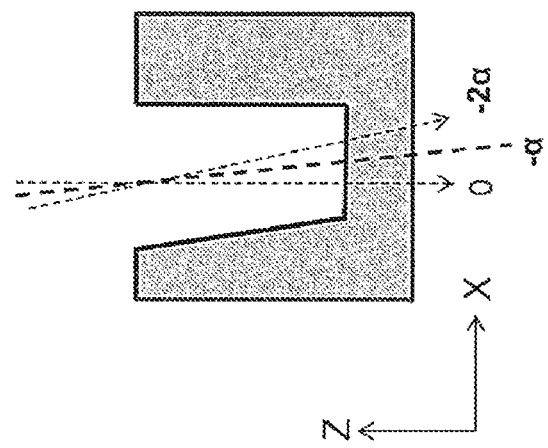
Figure 3F:
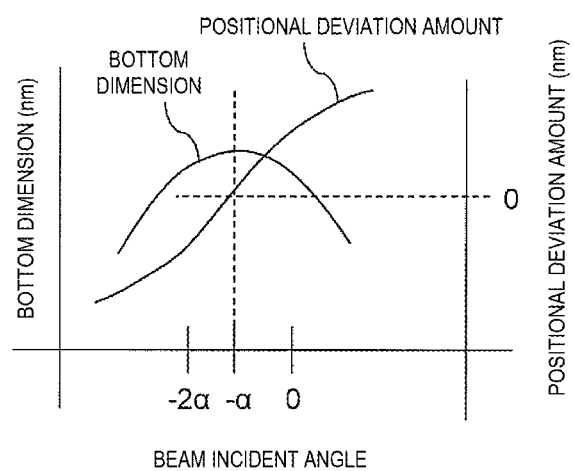
FIG. 3F is a diagram following FIGS. 3A to 3E.

Hereinafter, necessity of bottom observation by tilting the beam to match the inclination of the pattern shape will be described with reference to FIGS. 3A and 3B. FIG. 3A(a) is a cross-sectional view of the groove-shaped pattern, and an on-groove pattern is inclined by $-\alpha°$ and etched with respect to the perpendicular (the Z axis) of the sample. FIGS. 3A(b) to 3A(e) are diagrams showing an example of images obtained by the detector 9 and the detector 10 based on the beam scanning for the pattern illustrated in FIG. 2(*a*). Here, a secondary electron image by the detector 9 is acquired such that the center of the image always matches the center of the groove on the surface with respect to three different incident angles ($-2\alpha°$, $-\alpha°$, $0°$), as shown in FIG. 3A(b). FIGS. 3A(c) to (e) respectively represent back scattered electron images by the detector 10 at incident angles of $-2\alpha°$, $-\alpha°$, and $0°$. FIG. 3A(c) is a back scattered electron image when the incident angle is $-2\alpha°$. Since the center of the bottom of the groove is shifted to the left ($-$X) direction from the center of the image, a deviation amount ($b_{13}$) is a negative value. In addition, since the left side of the bottom is hidden by the side wall, a bottom dimension ($b_{11}$-$b_{12}$) is measured to be smaller than actual one. FIG. 3A(d) is a back scattered electron image when the incident angle is $-\alpha°$. Since the center of the bottom of the groove matches the center of the image, a deviation amount ($b_{23}$) is zero. In this case, since the overall groove bottom is observed without being shaded by the side wall, a bottom dimension ($b_{21}$-$b_{22}$) can be correctly measured. FIG. 3A(e) is a back scattered electron image when the incident angle is $0°$. Since the center of the bottom of the groove is shifted to the right ($+$X) direction from the center of the image, a deviation amount ($b_{33}$) is a positive value. In addition, since the right side of the bottom is hidden by the side wall, a bottom dimension ($b_{31}$-$b_{32}$) is measured to be smaller than actual one. A relationship among the beam incident angle, the bottom dimension and the positional deviation amount is summarized in FIG. 3B(f). The bottom dimension is a maximum value at the beam incident angle at which the positional deviation amount is zero, and the bottom dimension is measured to be smaller as an absolute value of the deviation amount increases. That is, when trying to accurately measure the bottom dimension, it is necessary to set the beam incident angle such that the positional deviation amount between the upper and lower parts of the pattern is zero. Also, in the measurement of the pattern inclination amount, in a state where a part of the bottom is hidden by a shadow of the side wall, since an error occurs due to the positional deviation amount measured smaller than actual one, measurement in a state where the positional deviation amount is small is desirable.

When the incident angle is controlled such that the positional deviation amount is zero, a relationship of change between the beam incident angle and the positional deviation amount is measured in advance to obtain the relational expression. Using the relational expression, the beam incident angle is changed by an amount corresponding to the measured positional deviation amount, and a procedure of obtaining the relational expression will be described with reference to FIG. 4.

Figure 4A:
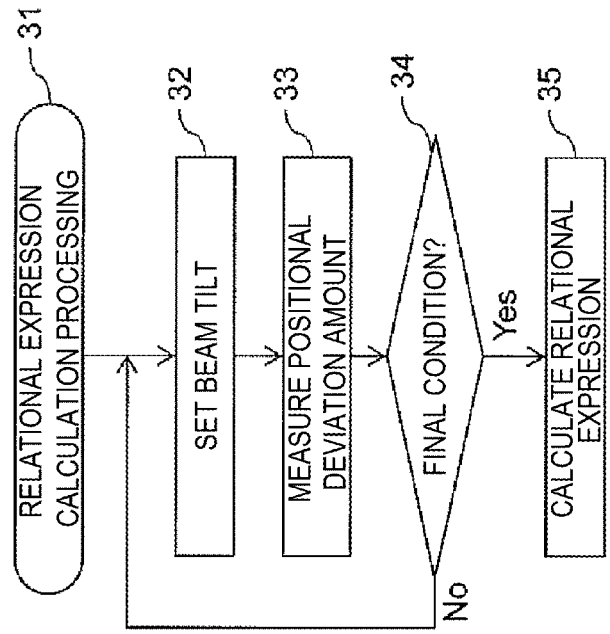
FIGS. 4A and 4B show diagrams showing an example of a correction coefficient calculation process for correcting a tilt amount of the incident beam.
Figure 4B:
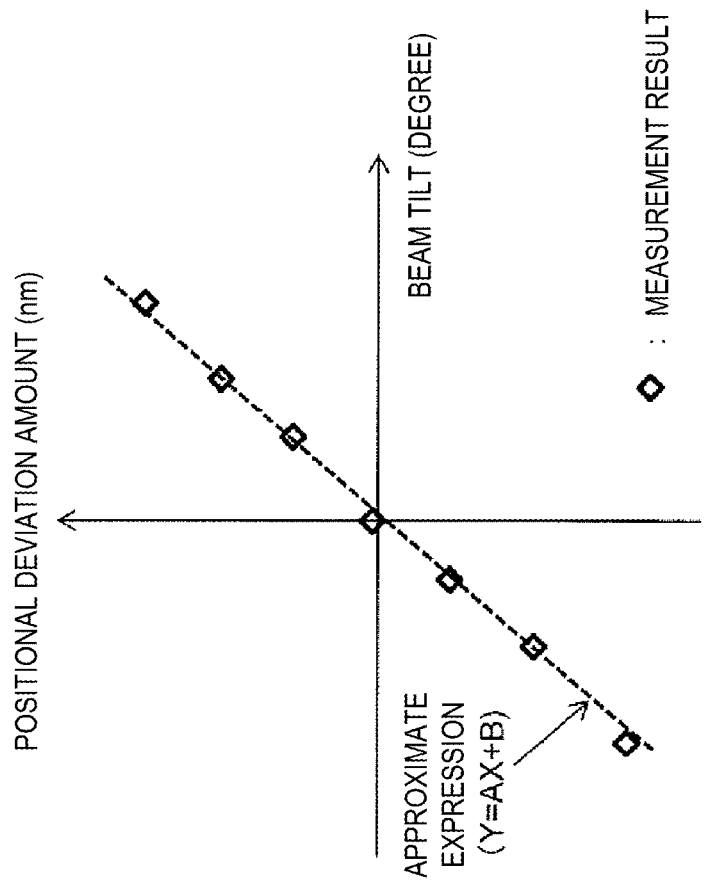

FIG. 4(a) is a flowchart showing a process of calculating a relational expression between a relative angle between the pattern and the incident beam and a deviation amount between the surface and the bottom. In the relational expression calculation processing (step 31), beam tilt setting (step 32) and positional deviation amount measurement (step 33) are repeated until all predetermined conditions are completed (No). When it is determined that a final condition is satisfied (yes) in a process of determining whether the condition is the final condition (step 34), a processing of calculating the relational expression (step 35) is executed based on a series of measurement results. FIG. 4(b) is a diagram in which the measurement results are plotted with a horizontal axis representing the beam tilt angle and a vertical axis representing the measured positional deviation amount. The relational expression is calculated by obtaining an approximate expression for the measurement result by, for example, a least squares method. In the present embodiment, although a linear function (Y=AX+B) is used as the approximate expression, a format of the approximate expression is not limited thereto, and may be a higher-order function (for example, a cubic expression). When performing approximation by a linear expression, a first-order coefficient (A) is a change amount (nm/deg) of the positional deviation with respect to the change in beam tilt, and a zero-order coefficient (B) indicates a value corresponding to the pattern inclination when the groove pattern used for calculating the relational expression is not vertical. In a beam tilt control in accordance with etched pattern inclination described below, the first-order coefficient (A) is used to calculate inclination of the etched pattern based on the measured deviation amount. That is, when a positional deviation amount measured by the 0° incident beam is $\Delta Y$, a beam tilt angle ($\Delta X$) that matches the inclination of the pattern is calculated by the following formula.

$$\Delta X = -\Delta Y/A$$

The reason why the formula is negative is that beam shift is performed in a direction where the positional deviation amount is canceled. In the first embodiment, data is acquired by changing the angle of the incident beam in order to calculate the relational expression. However, data may be acquired by changing the inclination of the sample in a state of fixing the angle of the incident beam.

Next, a sequence of a recipe processing (step 41) in the present embodiment will be described with reference to a flowchart of FIG. 5. When a recipe is started, wafer loading (step 42) and alignment (step 43) are executed. Hereinafter, for each measurement point set in the recipe, first, a beam tilt is set to an initial value (step 44), then, a dimension value of the upper and lower parts of the pattern and a positional deviation amount between the upper and lower parts are measured (step 45), and an inclination angle of the pattern is calculated using a first-order coefficient of the relational expression obtained in advance (step 46). Determination of whether the calculated inclination amount is within a threshold value is performed (step 47). If the calculated inclination amount is within the threshold value, the dimension value measured in (step 45) and the pattern inclination amount calculated in (step 46) are taken as defined values, and the processing is moved to a next measurement point. If the calculated inclination amount is outside the threshold Value, a beam tilt angle is set to match the pattern inclination (step 48), and the dimension and the positional deviation amount are re-measured. When it is determined that all measurement points set in the recipe are completed (step 49), the wafer is unloaded (step 50), and the recipe is ended (step 51).

Second Embodiment

A hole pattern measurement technique using a pattern measurement device according to a second embodiment of the invention will be described below. In the case of the groove pattern shown in the first embodiment, the incident beam may be controlled only in one direction. In the case of a hole pattern shown in the second embodiment, it is necessary to control the beam inclination in both X and Y directions. In the second embodiment, a correction expression in the X direction and the Y direction is obtained, and the correction is performed in each direction.

Figure 6D:
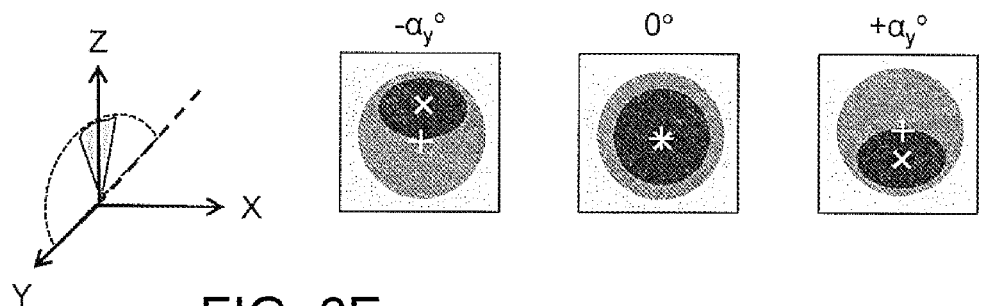
FIGS. 6D and 6E show diagrams following FIGS. 6A to 6C.
Figure 6E:
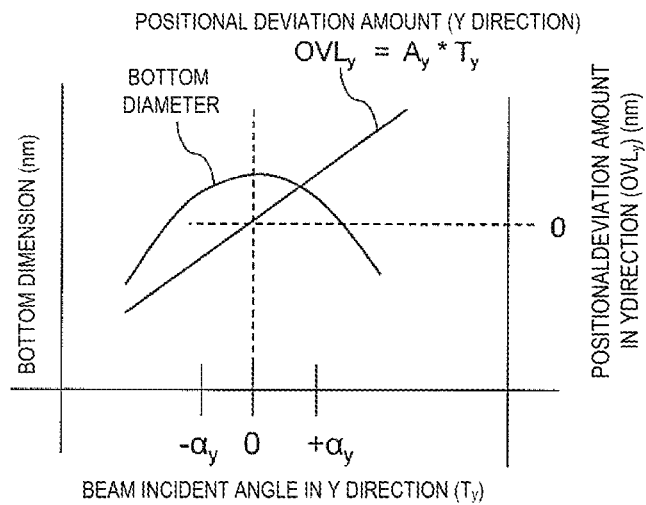

FIG. 6A(a) is a cross-sectional view of a hole-shaped pattern, and a hole H is etched with respect to the perpendicular (the Z axis) of the sample. FIG. 6A(b) illustrates, when an image is captured such that the center of the top of the hole pattern is the center of the image, a shape and a center position of the bottom of the hole pattern with respect to three beam incident angles different in the X direction. When the incident angle matches the pattern etching direction (an incident angle 0°), the center of the top matches the center of the bottom. On the other hand, when an incident beam is inclined toward a −X side (an incident angle $-\alpha_x°$), the bottom is deviated in the −X direction with respect to the top. Similarly, when the incident beam is inclined toward a +X side (an incident angle $+\alpha_x°$), the bottom is deviated in the +X direction with respect to the top. By measuring a deviation amount with respect to the incident beam angles in this manner, as shown in FIG. 6A(c), a relational expression between the beam incident angles in the X direction and the positional deviation amount in the X direction is calculated. The relational expression is shown below.

$$OVL_x = A_x * T_x$$

Further, FIG. 6B(d) illustrates, when an image is captured such that the center of the top of the hole pattern is the center of the image, a shape and a center position of the bottom of the hole pattern with respect to three beam incident angles different in the Y direction. When the incident angle matches the pattern etching direction (the incident angle 0°), the center of the top matches the center of the bottom. When the incident beam is inclined toward a −Y side (an incident angle −α_y°), the bottom is deviated in the −Y direction with respect to the top. Similarly, when the incident beam is inclined toward a +Y side (an incident angle +α_y°), the bottom is deviated in the +Y direction with respect to the top. By measuring the deviation amount with respect to the incident beam angles in this manner, as shown in FIG. 6B(e), a relational expression between the beam incident angle in the Y direction and the positional deviation amount in the X direction is calculated.

The relational expression is shown below.

$$OVL_y = A_y * T_y$$

For example, as shown in FIG. 7, when the center of the bottom of the hole pattern is positional-deviated by $OVL_x$ and $OVL_y$ in the X direction and the Y direction respectively, by tilting the incident beam by $-(OVL_x/A_x)$ in the X direction and $-(OVL_y/A_y)$ in the Y direction, the beam can be emitted in parallel to the etching direction of the hole pattern.

Here, a recipe sequence according to the second embodiment is the same as that of the first embodiment except that a correction direction for the incident beam is in two directions of X and Y.

An example of a measurement result output in the second embodiment is shown in FIG. 8. For each measurement point, a chip X coordinate (a column 61), an chip Y coordinate (a column 62), an in-chip X coordinate (a column 63), an in-chip Y coordinate (a column 64), a hole top diameter (a column 65), a hole bottom diameter (a column 66), a pattern inclination in X direction (a column 67), a pattern inclination in Y direction (a column 68), a pattern inclination direction (a column 69), and an absolute inclination amount of pattern (a column 70) are displayed.

Here, the pattern inclination direction and the absolute inclination amount of the pattern are calculated by the following formula.

(Pattern inclination direction)=$a$ tan {(pattern inclination in $Y$ direction)/(pattern inclination in $X$ direction)}

(Absolute inclination amount of pattern)=$\sqrt{\{(\text{pattern inclination in } X \text{ direction})^2+(\text{pattern inclination in } Y \text{ direction})^2\}}$ Third Embodiment In the first embodiment, the procedure of calculating the pattern inclination amount based on the measurement results of the positional deviation amount by obtaining the relational expression between the relative angle between the incident beam and the etching pattern and the positional deviation amount is described. If the shape of the etching pattern to be measured is constant, the same relational expression can be used. However, for example, when a pattern depth changes, the relational expression needs to be obtained again.

Figure 9A:
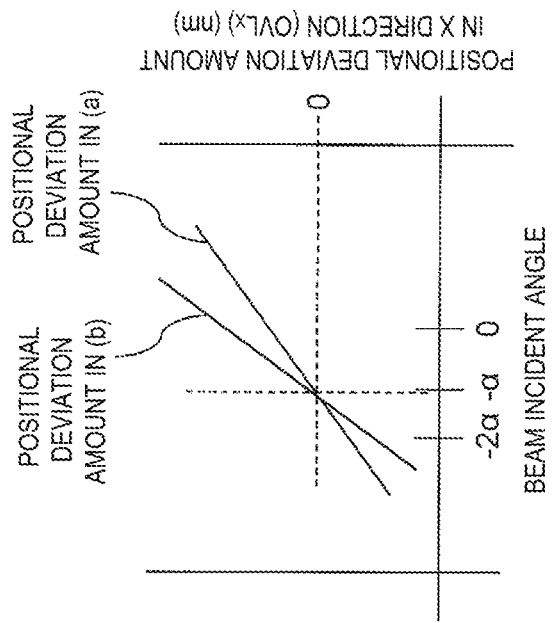
FIGS. 9A to 9C show diagrams showing an example of a correction coefficient change due to a process change in the third embodiment.
Figure 9B:
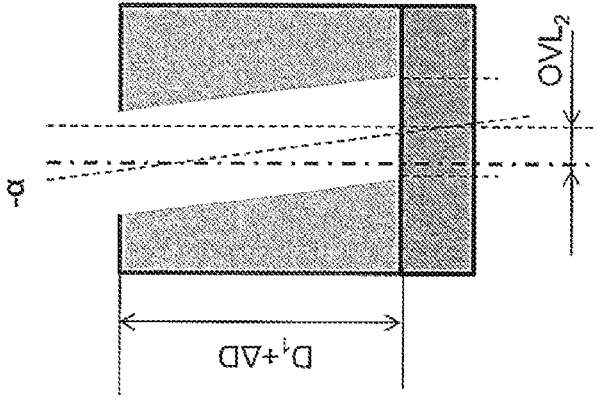
Figure 9C:
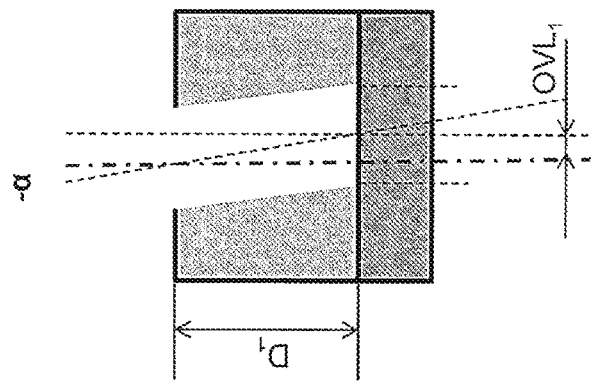

For example, as shown in FIGS. 9(a) and (b), when a depth of a layer to be etched changes from $D_1$ to $D_1+\Delta D$, the positional deviation amount to be measured increases even if the inclination angle of the pattern is the same (−α°). That is, as shown in a graph of FIG. 9(c), a change amount (nm/deg) of the positional deviation per unit beam tilt change is different between FIG. 9(a) and FIG. 9(b). Therefore, each time the etching process is changed, re-measurement of the relational expression and re-registration to the recipe are required, and operation efficiency of the device is reduced. Therefore, in the third embodiment, even if the etching process is changed, a unit for making it unnecessary to re-register the relational expression is provided.

As shown in FIG. 10 corresponding to FIG. 5, after the wafer alignment (step 43), the relational expression calculation processing (step 31) is added. The procedure of calculating the relational expression is the same as that described with reference to FIG. 4 in the first embodiment. However, various parameters (a capture position in the wafer and a range in which the incident beam angle is changed) for relational expression calculation are registered in the recipe.

Fourth Embodiment

Figure 11A:
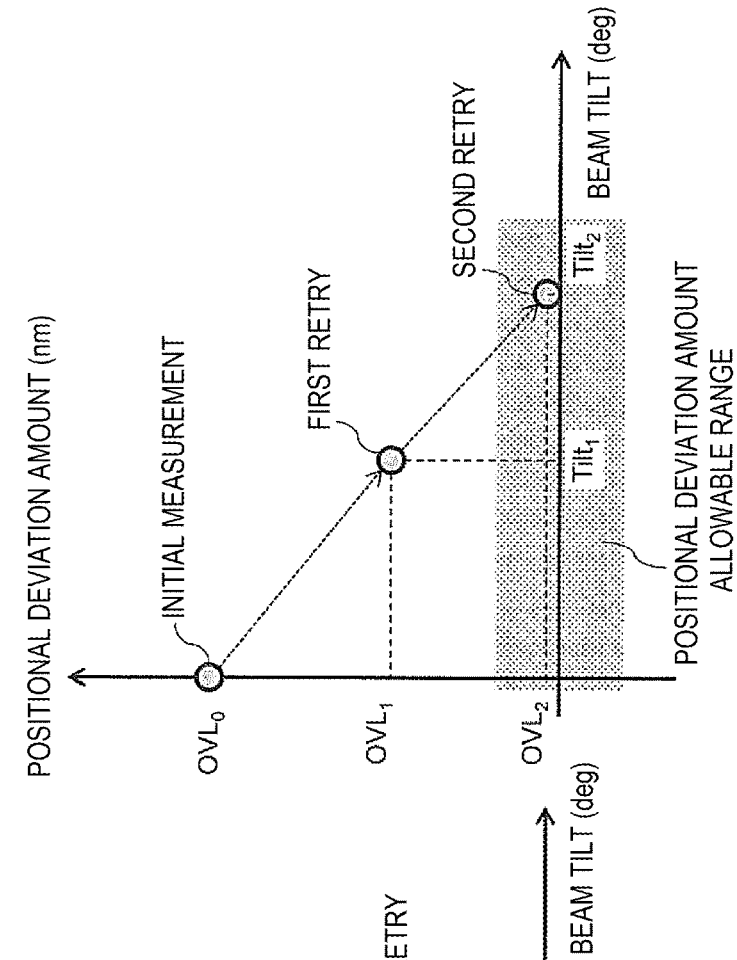
FIGS. 11A and 11B show diagrams showing an effect of updating a correction coefficient according to the fourth embodiment.
Figure 11B:
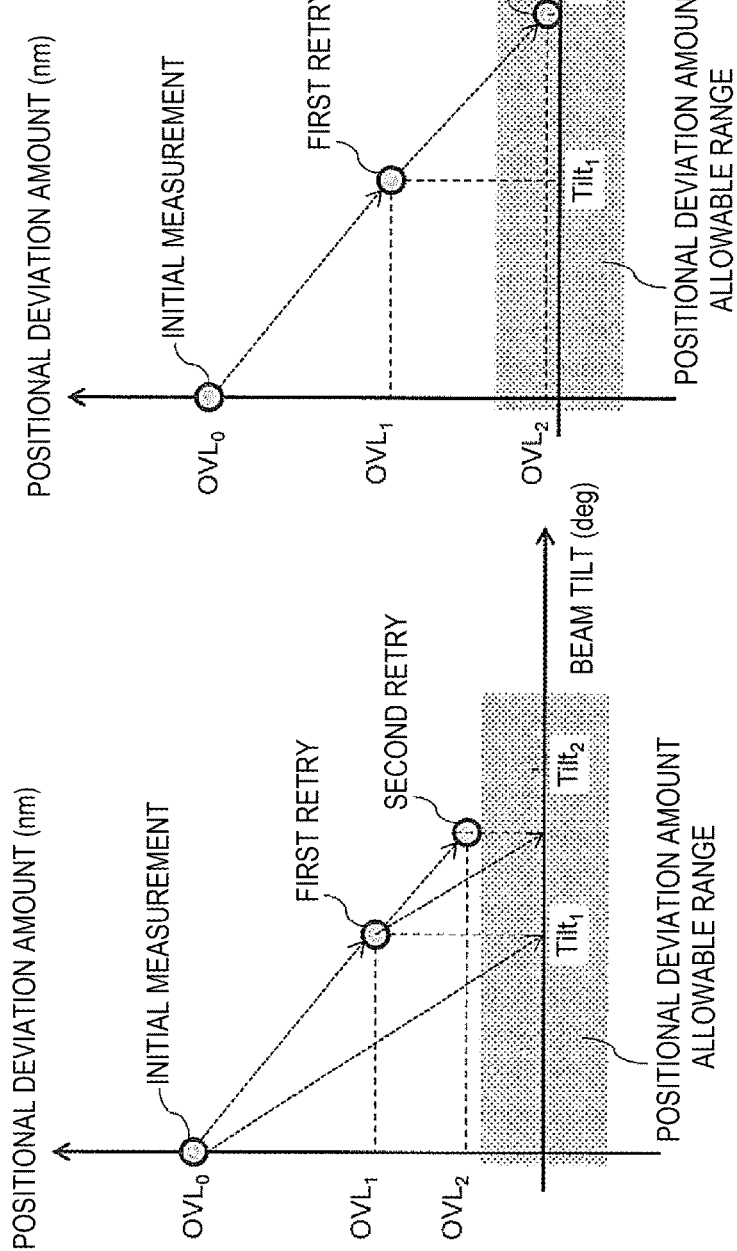

If there is an error in a correction coefficient in correcting the beam tilt, a larger number of retries are required in order to converge the positional deviation amount to zero. For example, FIG. 11(a) shows a case where a correction coefficient obtained in advance for an actual pattern is deviated and a correction amount is insufficient. However, when the same correction coefficient continues to be used, a positional deviation amount allowable range is not converged even in a second retry. Therefore, in the second retry, a measurement result of a first retry is reflected in the correction amount. In FIG. 11(b), in the second retry, by using $(OVL_1-OVL_0)/Tilt_1$ as the correction coefficient, it is possible to converge to the positional deviation amount around zero in the second retry.

In the fourth embodiment, in the beam tilt angle setting process (step 48) of FIG. 5, a processing of updating the correction coefficient based on the results of the retries so far is added in the second and subsequent retries.

Fifth Embodiment

In the measurement in the manufacturing process of the semiconductor device, throughput is an important factor. Therefore, different conditions are set for measurement for correcting the beam tilt to an appropriate angle and final measurement based on the corrected beam tilt angle.

In the fifth embodiment, in a positional deviation amount measurement process (step 52) for inclination correction, high speed capturing is performed under a condition with a small number of frame additions. During the dimension and pattern inclination measurement (step 53) after the beam tilt angle is determined, an image with a large number of frame additions and a high SN is acquired and length measurement is performed with high accuracy.

As another form according to the fifth embodiment, in the positional deviation amount measurement process (step 52), only a part of a plurality of patterns are measured in the image for shortening calculation time. When the positional deviation amount is within an allowable value, the dimension and pattern inclination measurement (step 53) is executed for all patterns in the same image without reacquiring the image.

Further, in another form, in the positional deviation amount measurement (step 52), the positional deviation amounts of a plurality of patterns in the image are measured, and in the dimension and pattern inclination measurement (step 53), individual patterns are sequentially captured at inclination angles that match the individual patterns, and highly accurate measurement of the individual pattern is performed.

The invention is not limited to configurations and the like shown in the drawings in the embodiments described above, and these can be appropriately modified within a range in which the effect of the invention is exhibited. Various modifications can be made thereto without departing from the scope of the object of the invention.

Any selection can be optionally made from each component of the invention, and an invention which includes the selected configuration is also included in the invention.

REFERENCE SIGN LIST 1 column
2 sample chamber
3 electron gun
4 condenser lens
5 aligner
6 E×B filter
7 deflector
8 objective lens
9 secondary electron detector
10 back scattered electron detector
11 wafer
12 standard sample
13 XY stage
14 optical microscope
15, 16 amplifier
17 beam scanning controller
18 stage controller
19 image processing board
20 control PC
31 to 35 each step of relational expression calculation
41 to 53 each step of recipe sequence in embodiments All publications, patents, and patent applications cited in the description are hereby incorporated in the description by reference as they are.

The invention claimed is:

1. A charged particle beam device comprising:
a calculation device that performs calculation for measuring a dimension of a pattern formed on a sample based on a signal obtained by emitting the sample with a charged particle beam, wherein
the calculation device calculates an inclination amount of the pattern based on a calculation value of a positional deviation amount between two patterns having different heights in a direction parallel to a sample surface calculated based on an image acquired at any beam tilt angle according to a relational expression acquired in advance between the positional deviation amount and the inclination amount of the pattern.

2. The charged particle beam device according to claim 1, wherein
the calculation device controls the beam tilt angle to match the inclination amount of the pattern so that the image is acquired again and the pattern is measured.

3. The charged particle beam device according to claim 1, wherein
the calculation device calculates a calibration amount of an electron beam trajectory based on a shape of a standard sample appearing in the image.

4. The charged particle beam device according to claim 2, wherein
the calculation device controls the beam tilt angle to match the inclination amount of the pattern so as to execute image reacquisition processing when the positional deviation amount is larger than a threshold value.

5. The charged particle beam device according to claim 1, comprising:
at least two or more detectors for secondary electron detection and back scattered electron detection, wherein
the calculation device calculates the positional deviation amount based on a surface pattern position calculated based on a secondary electron image and a pattern position near a bottom of an etched shape calculated based on a back scattered electron image.

6. The charged particle beam device according to claim 1, wherein
the relational expression between the positional deviation amount and the inclination amount of the pattern is calculated by emitting a beam at a plurality of beam tilt angles and measuring the positional deviation amount at each beam tilt angle.

7. The charged particle beam device according to claim 6, wherein
the relational expression is held independently for two different directions.

8. The charged particle beam device according to claim 6, wherein
the relational expression is obtained at the start of a recipe.

9. The charged particle beam device according to claim 2, wherein
the calculation device, until the positional deviation amount is within a specified value, repeatedly executes a process of calculating the positional deviation amount, calculating the inclination amount of the pattern according to the relational expression, and acquiring an image by adjusting the beam tilt angle to the inclination amount of the pattern.

10. The charged particle beam device according to claim 9, wherein
the calculation device performs, at each measurement point, correction of the beam tilt angle while correcting the relational expression from data during the correction.

11. The charged particle beam device according to claim 2, wherein
in a process of adjusting the beam tilt angle to the inclination amount of the pattern and a subsequent pattern measurement process, different image acquisition conditions are used.

12. The charged particle beam device according to claim 11, wherein
an image acquisition time condition in the subsequent pattern measurement process shorter than that of the process of adjusting the beam tilt angle to the inclination amount of the pattern is used.

13. The charged particle beam device according to claim 2, wherein
in a process of adjusting the beam tilt angle to the inclination amount of the pattern and a subsequent pattern measurement process, different measurement conditions are used.

14. The charged particle beam device according to claim 12, wherein
in the process of adjusting the beam tilt angle to the inclination amount of the pattern, the number of patterns to be measured is smaller than that of the subsequent pattern measurement process.

15. The charged particle beam device according to claim 1, wherein
the inclination amount of the pattern is calculated based on the beam tilt angle during image acquisition, the positional deviation amount, and the relational expression, and is output as a measurement value.

16. The charged particle beam device according to claim 15, wherein
the inclination amount of the pattern is output as an inclination direction on a sample surface and an inclination angle from a direction perpendicular to the sample.

17. The charged particle beam device according to claim 15, wherein
the inclination amount of the pattern is output as an inclination amount with respect to two different directions on a sample surface.

18. A pattern measurement method comprising:
a calculation method of measuring a dimension of a pattern formed on a sample based on a signal obtained by emitting the sample with a charged particle beam, the calculation method including:
calculating an inclination amount of the pattern based on a calculation value of a positional deviation amount between two patterns having different heights with respect to a direction parallel to a sample surface calculated based on an image acquired at any beam tilt angle according to a relational expression acquired in advance between the positional deviation amount and the inclination amount of the pattern.

19. The pattern measurement method according to claim 18, wherein
the calculation method includes controlling the beam tilt angle to match the inclination amount of the pattern so that the image is acquired again and the pattern is measured.

* * * * *